(12) United States Patent
Ran et al.

(10) Patent No.: US 11,949,388 B2
(45) Date of Patent: Apr. 2, 2024

(54) POWER AMPLIFIER AND POWER AMPLIFYING METHOD

(71) Applicant: Realtek Semiconductor Corporation, Hsinchu (TW)

(72) Inventors: Gen-Sheng Ran, Hsinchu (TW); Po-Chih Wang, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 234 days.

(21) Appl. No.: 17/533,294

(22) Filed: Nov. 23, 2021

(65) Prior Publication Data

US 2022/0239264 A1 Jul. 28, 2022

(30) Foreign Application Priority Data

Jan. 25, 2021 (TW) .................................. 110102733

(51) Int. Cl.
*H03F 3/217* (2006.01)
*H03F 1/02* (2006.01)

(52) U.S. Cl.
CPC .................................. *H03F 3/217* (2013.01)

(58) Field of Classification Search
CPC ............... H03F 3/217; H03F 2200/411; H03F 2200/511; H03F 1/0211; H03F 2200/534; H03F 2200/537; H03F 2200/541; H03F 2203/45652; H03F 2203/45731; H03F 3/45188; H03F 3/45475

USPC ................................. 330/296–297, 136, 310
See application file for complete search history.

(56) References Cited

U.S. PATENT DOCUMENTS 8,294,522 B2 * 10/2012 Flint ..................... H03F 1/0222
330/297
8,884,702 B2 * 11/2014 Afsahi ................... H03F 3/245
330/296

FOREIGN PATENT DOCUMENTS

TW 201742372 A 12/2017

* cited by examiner

*Primary Examiner* — Hieu P Nguyen
(74) *Attorney, Agent, or Firm* — Locke Lord LLP; Tim Tingkang Xia, Esq.

(57) ABSTRACT

A power amplifier includes a power switching circuit, a driver circuit, and an amplifier circuit. The power switching circuit is configured to receive a first voltage and a second voltage, and provide the first voltage or the second voltage according to an operation mode of the power amplifier. The driver circuit is coupled to the power switching circuit. The driver circuit is configured to operate according to the first voltage or the second voltage and generate a driving signal according to an input signal. The amplifier circuit is coupled to the power switching circuit and the driver circuit. The amplifier circuit is configured to operate according to the first voltage or the second voltage and generate an output signal according to the driving signal.

18 Claims, 4 Drawing Sheets

POWER AMPLIFIER AND POWER AMPLIFYING METHOD

RELATED APPLICATIONS

This application claims priority to Taiwanese Application Serial Number 110102733, filed Jan. 25, 2021, which is herein incorporated by reference.

BACKGROUND

Technical Field

The present disclosure relates to power amplifying technology. More particularly, the present disclosure relates to a power amplifier and a power amplifying method which can switch different power.

Description of Related Art

With developments of integrated circuits and communication technology, power amplifiers have been applied to many communication systems. In practical applications, a communication system may need to support different operations modes. For example, a communication system needs to support Wi-Fi mode and Blue-tooth mode. However, in some related approaches, it needs to dispose two different amplifiers in this communication system to realize the two different operation modes.

SUMMARY

Some aspects of the present disclosure are to provide a power amplifier. The power amplifier includes a power switching circuit, a driver circuit, and an amplifier circuit. The power switching circuit is configured to receive a first voltage and a second voltage, and provide the first voltage or the second voltage according to an operation mode of the power amplifier. The driver circuit is coupled to the power switching circuit. The driver circuit is configured to operate according to the first voltage or the second voltage and generate a driving signal according to an input signal. The amplifier circuit is coupled to the power switching circuit and the driver circuit. The amplifier circuit is configured to operate according to the first voltage or the second voltage and generate an output signal according to the driving signal.

Some aspects of the present disclosure are to provide a power amplifying method. The power amplifying method includes following operations: receiving, by a power switching circuit of a power amplifier, a first voltage and a second voltage, and proving, by the power switching circuit, the first voltage or the second voltage according to an operation mode of the power amplifier; generating, by a driver circuit of the power amplifier, a driving signal according to an input signal, in which the driver circuit operates according to the first voltage or the second voltage; and generating, by an amplifier circuit of the power amplifier, an output signal according to the driving signal, in which the amplifier circuit operates according to the first voltage or the second voltage.

Based on the descriptions above, the power amplifier and the power amplifying method of the present disclosure can use the power switching circuit to provide different voltages to the driver circuit and the amplifier circuit. Accordingly, the same driver circuit and the same amplifier circuit can be used for different operation modes to reduce size and save power.

BRIEF DESCRIPTION OF THE DRAWINGS

The disclosure can be more fully understood by reading the following detailed description of the embodiment, with reference made to the accompanying drawings as follows.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
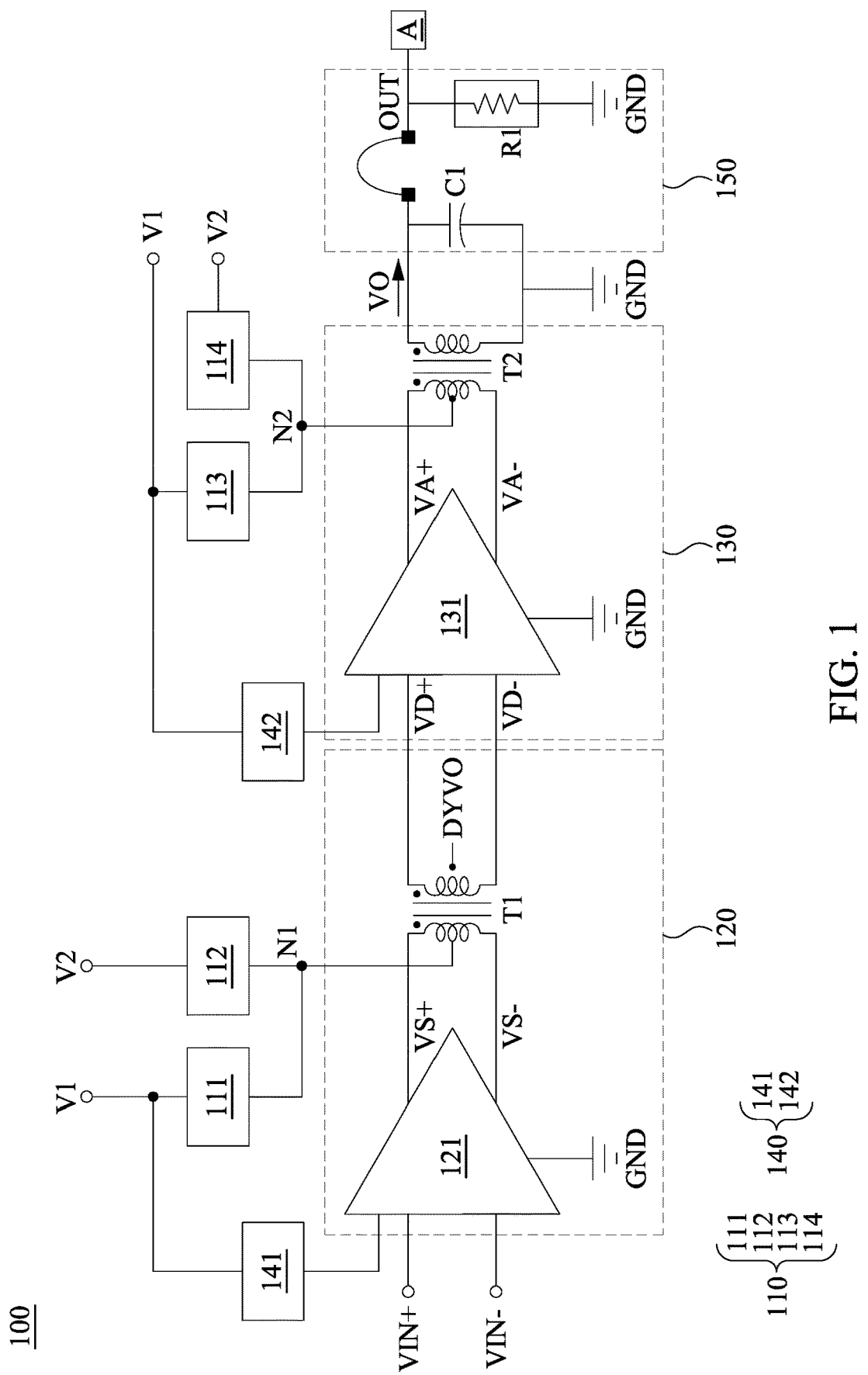
FIG. 1 is a schematic diagram of a power amplifier according to some embodiments of the present disclosure.

Reference is made to FIG. 1. FIG. 1 is a schematic diagram of a power amplifier 100 according to some embodiments of the present disclosure.

In some embodiments, the power amplifier 100 is disposed in a transmitter of a communication system. In some embodiments, the power amplifier 100 can support different operation modes. For example, the power amplifier 100 not only can support a Wi-Fi mode but also can support a Blue-tooth mode to transmit signals (for example, an output signal VO) with Wi-Fi standard or Blue-tooth standard.

As illustrated in FIG. 1, the power amplifier 100 includes a power switching circuit 110, a driver circuit 120, an amplifier circuit 130, a bias circuit 140, and a load circuit 150.

The power switching circuit 110 is configured to receive a voltage V1 and a voltage V2, and provide the voltage V1 or the voltage V2 according to an operation mode of the power amplifier 100. For example, the power switching circuit 110 includes a switch circuit 111, a switch circuit 112, a switch circuit 113, and a switch circuit 114. The switch circuits 111 and 113 are configured to receive the voltage V1. The switch circuits 112 and 114 are configured to receive the voltage V2. In some embodiments, the switch circuits 111 and 113 are implemented by P-type transistors, and the switch circuits 112 and 114 are implemented by N-type transistors. When the operation mode of the power amplifier 100 is the Wi-Fi mode, the switch circuits 111 and 113 are turned on to output the voltage V1, and the switch circuits 112 and 114 are turned off. When the operation mode of the power amplifier 100 is the Blue-tooth mode, the switch circuits 112 and 114 are turned on to output the voltage V2, and the switch circuits 111 and 113 are turned off. Since power of the Wi-Fi mode is higher, the voltage V1 can be designed to be higher than the voltage V2. For example, the voltage V1 may be 3 volts and the voltage V2 may be 1.3 volts.

The implementations of the aforementioned switch circuits 111-114 and the values of the voltages V1-V2 are merely for illustration, and other suitable implementations of the switch circuits 111-114 and other suitable values of the voltage V1-V2 are within the contemplated scopes of the present disclosure. For example, each of the aforementioned switch circuits 111-114 can be implemented by multiple transistors.

The driver circuit 120 is coupled to the power switching circuit 110 to receive the voltage V1 or the voltage V2 and operates according to the voltage V1 or the voltage V2. The driver circuit 120 is configured to receive input signals VIN+ and VIN−. In some embodiments, the input signals VIN+ and VIN− are from an analog-to-digital converter. The driver circuit 120 is further configured to generate driving signals VD+ and VD− according to the input signals VIN+ and VIN−. For example, the driver circuit 120 includes a driver 121 and a transformer T1. The driver 121 is coupled to a ground terminal GND and operates according to a bias voltage from a bias device 141. The driver 121 is further configured to receive the input signals VIN+ and VIN− and generate signals VS+ and VS− according to the input signals VIN+ and VIN−. The transformer T1 and the switch circuits 111-112 are coupled to a node N1 to receive the voltage V1 transmitted form the switch circuit 111 or to receive the voltage V2 transmitted form the switch circuit 112. The transformer T1 is further configured to receive a bias voltage DYVO. The transformer T1 operates according to the bias voltage DYVO and one of the voltage V1 and the voltage V2 to generate the driving signals VD+ and VD− according to the signals VS+ and VS−. In some embodiments, the transformer T1 is a Balun transformer. The function of the transformer T1 is similar to an inductor and configured for impedance transformation.

The amplifier circuit 130 is coupled to the power switching circuit 110 to receive the voltage V1 or the voltage V2 and operates according to the voltage V1 or the voltage V2. The amplifier circuit 130 is further coupled to the driver circuit 120 to receive the driving signals VD+ and VD− and to generate an output signal VO according to the driving signals VD+ and VD−. For example, the amplifier circuit 130 includes an amplifier 131 and a transformer T2. The amplifier 131 is coupled to the ground terminal GND and operates according to a bias voltage from a bias device 142. The amplifier 131 is further configured to receive the driving signals VD+ and VD− and generate amplified signals VA+ and VA− according to the driving signals VD+ and VD−. The transformer T2 and the switch circuits 113-114 are coupled to a node N2 to receive the voltage V1 transmitted from the switch circuit 113 or to receive the voltage V2 transmitted form the switch circuit 114. The transformer T2 operates according to one of the voltage V1 and the voltage V2 to generate the output signal VO according to the amplified signals VA+ and VA−. In some embodiments, the transformer T2 is a Balun transformer. The function of the transformer T2 is differential to single-end conversion and configured for impedance transformation.

The bias circuit 140 includes the aforementioned bias device 141 and the bias device 142. The bias device 141 is configured to receive the voltage V1 and operate according to the voltage V1, and provide the voltage V1 to the driver 121. The bias device 142 is configured to receive the voltage V1 and operate according to the voltage V1, and provide control bias voltages (e.g., control bias voltages VB1 and VB2 in FIG. 2) to the amplifier 131.

The load circuit 150 includes a resistor R1 and a capacitor C1. The capacitor C1 is coupled between an output terminal of the transformer T2 and the ground terminal GND. The capacitor C1 is coupled to the resistor R1 through a printed circuit board. The resistor R1 is coupled between an output terminal OUT and the ground terminal GND. In some embodiments, the capacitor C1 may be coupled to a switch in series to adjust an impedance of the output terminal OUT. For example, when the power amplifier 100 operates in the Blue-tooth mode, the switch can be turned on to provide larger impedance. The output signal VO is transmitted to an antenna A of a transmitter through the resistor R1, the capacitor C1 and the output terminal OUT. Then, the output signal VO is transmitted out from the antenna A.

In some related approaches, at least two amplifiers are disposed in a communication system which supports different operation modes. However, the size will be larger and power consumption will be larger. In addition, since the two amplifiers may be different from each other, there may be circuit mismatch problems.

Compared to the aforementioned related approaches, in the present disclosure, the power switching circuit 110 is used to provide different voltages to the driver circuit 120 and the amplifier circuit 130. Accordingly, the same driver circuit 120 and the same amplifier circuit 130 can be used for different operations modes to reduce area and save power. In addition, since the power amplifier 100 does not use multiple different amplifiers, it can avoid the problems of circuit mismatch.

It is noted that the present disclosure is described with differential signals but the present disclosure is not limited thereto. In some other embodiments, it can also be implemented with a single-ended signal.

Figure 2:
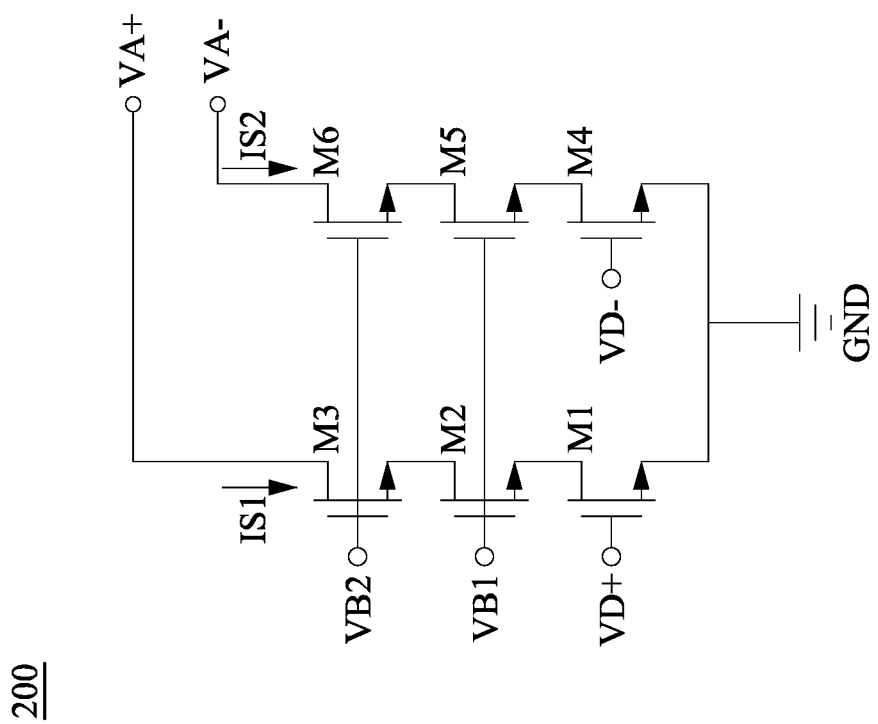
FIG. 2 is a schematic diagram of an amplifier according to some embodiments of the present disclosure.

Reference is made to FIG. 2. FIG. 2 is a schematic diagram of an amplifier 200 according to some embodiments of the present disclosure. In some embodiments, the amplifier 200 in FIG. 2 is configured to implement the amplifier 131 in FIG. 1.

As illustrated in FIG. 2, the amplifier 200 includes transistors M1-M6. In some embodiments, the transistors M1-M6 are implemented by N-type transistors, but the present disclosure is not limited thereto. The transistor M1 and the transistor M4 are coupled to the ground terminal GND. The transistor M2 and the transistor M1 are coupled in series. The transistor M3 and the transistor M2 are coupled in series. The transistor M5 and the transistor M4 are coupled in series. The transistor M6 and the transistor M5 are coupled in series. In some embodiments, the transistor M1 and the transistor M4 are low-voltage components and are core components. In other words, the transistor M1 and the transistor M4 have small parasitic capacitances. In some embodiments, the transistor M2 and the transistor M5 are low-voltage components and have larger sizes so that their low impedance characteristics do not affect linearity. In some embodiments, the transistor M3 and the transistor M6 are high-voltage components and are input/output components. In other words, the transistor M3 and the transistor M6 can withstand larger output voltage swings.

Gates terminals of the transistor M1 and the transistor M4 are configured receive the driving signals VD+ and VD− respectively. Gates terminals of the transistor M2 and the transistor M5 are configured receive the control bias voltage VB1. Gates terminals of the transistor M3 and the transistor M6 are configured receive the control bias voltage VB2. The control bias voltage VB1 and the control bias voltage VB2 can be configured to control a current IS1 flowing through the transistors M1-M3 or a current IS2 flowing through the transistors M4-M6 in order to control a cross voltage between a drain terminal and a source terminal of the transistor M1 or control a cross voltage between a drain terminal and a source terminal of the transistor M4 in order to ensure reliability of the transistors. Drain terminals of the transistor M3 and the transistor M6 are configured to output the amplified signals VA+ and VA− respectively.

In some embodiments, when the operation mode of the power amplifier 100 is the Wi-Fi mode, the control bias voltage VB2 has a first voltage. When the operation mode of the power amplifier 100 is the Blue-tooth mode, the control bias voltage VB2 has a second value. The second value can be larger than the first value. For example, when the operation mode of the power amplifier 100 is the Wi-Fi mode, the control bias voltage VB1 may be about 1.2 volts or 1.3 volts, and the control bias voltage VB2 may be about 2 volts. When the operation mode of the power amplifier 100 is the Blue-tooth mode, the control bias voltage VB1 may be about 1.2 volts or 1.3 volts, and the control bias voltage VB2 may be about 3.3 volts.

The values of the control bias voltages VB1-VB2 are merely for illustration, and the present disclosure is not limited thereto. Other suitable values of the control bias voltages VB1-VB2 are within the contemplated scopes of the present disclosure.

Figure 3:
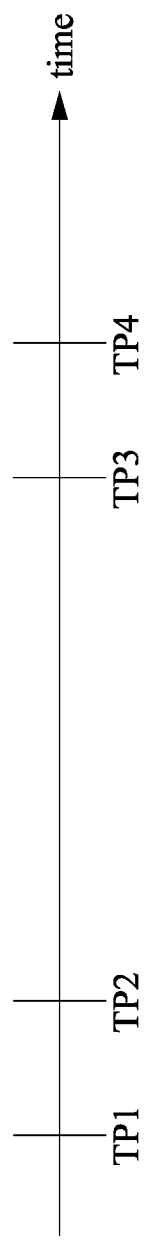
FIG. 3 is a timing sequence diagram of switch circuits in FIG. 1 according to some embodiments of the present disclosure.

Reference is made to FIG. 3. FIG. 3 is a timing sequence diagram of the switch circuits in FIG. 1 according to some embodiments of the present disclosure.

The switch circuit 111 and the switch circuit 112 are taken as an example below. The switch circuit 113 and the switch circuit 114 have similar operations so they are not described herein again.

When the operation mode of the power amplifier 100 changes from the Wi-Fi mode to the Blue-tooth mode, the switch circuit 111 and the switch circuit 112 are turned off first and then the switch circuit 112 is turned on. As illustrated in FIG. 3, the switch circuit 111 and the switch circuit 112 are turned off at a timing point TP1, and the switch circuit 112 is turned on at a timing point TP2, in which the timing point TP1 is earlier than the timing point TP2.

When the operation mode of the power amplifier 100 changes from the Blue-tooth mode to the Wi-Fi mode, the switch circuit 111 and the switch circuit 112 are turned off first and then the switch circuit 111 is turned on. As illustrated in FIG. 3, the switch circuit 111 and the switch circuit 112 are turned off at a timing point TP3, and the switch circuit 111 is turned on at a timing point TP4, in which the timing point TP3 is earlier than the timing point TP4.

By ensuring that the switch circuit 111 and the switch circuit 112 are turned off first and then the switch circuit 111 or the switch circuit 112 is turned on according to the operation mode of the power amplifier 100, it can prevent the switch circuits 111-112 from being turned on at the same timing point to avoid operating incorrectly.

Figure 4:
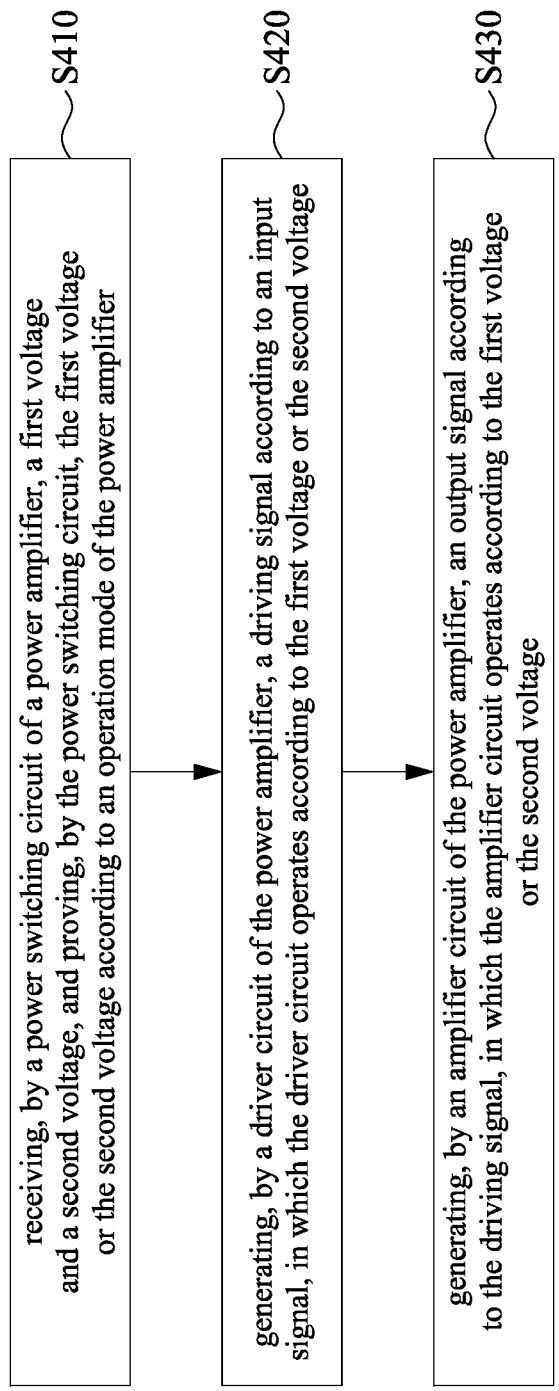
FIG. 4 is a flow diagram of a power amplifying method according to some embodiments of the present disclosure.

Reference is made to FIG. 4. FIG. 4 is a flow diagram of a power amplifying method 400 according to some embodiments of the present disclosure. As illustrated in FIG. 4, the power amplifying method 400 includes operations S410, S420, and S430.

In some embodiments, the power amplifying method 400 is applied to the power amplifier 100 in FIG. 1, but the present disclosure is not limited thereto. However, for better understanding, the power amplifying method 400 is described with referent to FIG. 1 below.

In operation S410, the power switching circuit 110 of the power amplifier 100 receives the voltage V1 and the voltage V2, and provides the voltage V1 or the voltage V2 according to the operation mode of the power amplifier 100. For example, when the operation mode of the power amplifier 100 is the Wi-Fi mode, the power switching circuit 110 outputs the voltage V1. When the operation mode of the power amplifier 100 is the Blue-tooth mode, the power switching circuit 110 outputs the voltage V2.

In operation S420, the driver circuit 120 of the power amplifier 100 operates according to the voltage V1 or the voltage V2 and generates the driving signals VD+ and VD− according to the input signals VIN+ and VIN−. For example, when the operation mode of the power amplifier 100 is the Wi-Fi mode, the driver circuit 120 operates according to the voltage V1 and generates the driving signals VD+ and VD− according to the input signals VIN+ and VIN−. When the operation mode of the power amplifier 100 is the Blue-tooth mode, the driver circuit 120 operates according to the voltage V2 and generates the driving signals VD+ and VD− according to the input signals VIN+ and VIN−.

In operation S430, the amplifier circuit 130 of the power amplifier 100 operates according to the voltage V1 or the voltage V2 and generates the output signal VO according to the driving signals VD+ and VD−. For example, when the operation mode of the power amplifier 100 is the Wi-Fi mode, the amplifier circuit 130 operates according to the voltage V1 and generates the output signal VO according to the driving signals VD+ and VD−. When the operation mode of the power amplifier 100 is the Blue-tooth mode, the amplifier circuit 130 operates according to the voltage V2 and generates the output signal VO according to the driving signals VD+ and VD−.

Based on the descriptions above, the power amplifier and the power amplifying method of the present disclosure can use the power switching circuit to provide different voltages to the driver circuit and the amplifier circuit. Accordingly, the same driver circuit and the same amplifier circuit can be used for different operation modes to reduce size and save power.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuity in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code to compile the script into a form that is used for the layout or fabrication of the ultimate circuitry.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A power amplifier, comprising:
a power switching circuit configured to receive a first voltage and a second voltage, and provide the first voltage or the second voltage according to an operation mode of the power amplifier;
a driver circuit coupled to the power switching circuit, wherein the driver circuit is configured to operate according to the first voltage or the second voltage and generate a driving signal according to an input signal; and an amplifier circuit coupled to the power switching circuit and the driver circuit, wherein the amplifier circuit is configured to operate according to the first voltage or the second voltage and generate an output signal according to the driving signal, wherein when the operation mode of the power amplifier is a Wi-Fi mode, the power switching circuit provides the first voltage to the driver circuit and the amplifier circuit, wherein when the operation mode of the power amplifier is a Blue-tooth mode, the power switching circuit provides the second voltage to the driver circuit and the amplifier circuit.

2. The power amplifier of claim 1, wherein the first voltage is higher than the second voltage.

3. The power amplifier of claim 1, wherein the driver circuit comprises:
a driver configured to receive the input signal and generate a first signal according to the input signal; and
a first transformer configured to operate according to the first voltage and the second voltage and generate the driving signal according to the first signal.

4. The power amplifier of claim 3, wherein the power switching circuit comprises:
a first switch circuit configured to receive the first voltage, and turned on under a condition that the operation mode of the power amplifier is the Wi-Fi mode to output the first voltage to the first transformer; and
a second switch circuit configured to receive the second voltage, and turned on under a condition that the operation mode of the power amplifier is the Blue-tooth mode to output the second voltage to the first transformer.

5. The power amplifier of claim 4, wherein when the operation mode of the power amplifier changes from the Wi-Fi mode to the Blue-tooth mode, the first switch circuit and the second switch circuit are turned off at a first timing point, and the second switch circuit is turned on at a second timing point, wherein the first timing point is earlier than the second timing point.

6. The power amplifier of claim 5, wherein when the operation mode of the power amplifier changes from the Blue-tooth mode to the Wi-Fi mode, the first switch circuit and the second switch circuit are turned off at a third timing point, and the first switch circuit is turned on at a fourth timing point, wherein the third timing point is earlier than the fourth timing point.

7. The power amplifier of claim 3, further comprising:
a bias circuit configured to receive the first voltage and provide the first voltage to the driver.

8. The power amplifier of claim 3, wherein the amplifier circuit comprises:
an amplifier configured to generate an amplified signal according to the driving signal; and
a second transformer configured to operate according to the first voltage or the second voltage and generate the output signal according to the amplified signal.

9. The power amplifier of claim 8, wherein the power switching circuit comprises:
a first switch circuit configured to receive the first voltage, and turned on under a condition that the operation mode of the power amplifier is the Wi-Fi mode to output the first voltage to the second transformer; and
a second switch circuit configured to receive the second voltage, and turned on under a condition that the operation mode of the power amplifier is the Blue-tooth mode to output the second voltage to the second transformer.

10. The power amplifier of claim 8, further comprising:
a bias circuit configured to receive the first voltage and provide a first control bias voltage and a second control bias voltage to the amplifier.

11. The power amplifier of claim 10, wherein the amplifier circuit comprises:
a first transistor coupled to a ground terminal;
a second transistor coupled to the first transistor in series;
a third transistor coupled to the second transistor in series;
a fourth transistor coupled to the ground terminal;
a fifth transistor coupled to the fourth transistor in series; and
a sixth transistor coupled to the fifth transistor in series,
wherein the first transistor and the fourth transistor are configured to receive the driving signal, the second transistor and the fifth transistor are configured to receive the first control bias voltage, and the third transistor and the sixth transistor are configured to receive the second control bias voltage and output the amplified signal.

12. The power amplifier of claim 11, wherein when the operation mode of the power amplifier is the Wi-Fi mode, the second control bias voltage has a first value, wherein when the operation mode of the power amplifier is the Blue-tooth mode, the second control bias voltage has a second value.

13. The power amplifier of claim 12, wherein the second value is greater than the first value.

14. A power amplifying method, comprising:
receiving, by a power switching circuit of a power amplifier, a first voltage and a second voltage, and proving, by the power switching circuit, the first voltage or the second voltage according to an operation mode of the power amplifier;
generating, by a driver circuit of the power amplifier, a driving signal according to an input signal, wherein the driver circuit operates according to the first voltage or the second voltage; and
generating, by an amplifier circuit of the power amplifier, an output signal according to the driving signal, wherein the amplifier circuit operates according to the first voltage or the second voltage,
wherein proving, by the power switching circuit, the first voltage or the second voltage according to the operation mode of the power amplifier, further comprising:
providing, by the power switching circuit, the first voltage to the driver circuit and the amplifier circuit when the operation mode of the power amplifier is a Wi-Fi mode; and
providing, by the power switching circuit, the second voltage to the driver circuit and the amplifier circuit when the operation mode of the power amplifier is a Blue-tooth mode.

15. The power amplifying method of claim 14, further comprising:
receiving, by a driver of the driver circuit, the input signal and generating, by the driver, a first signal according to the input signal; and
generating, by a first transformer of the driver circuit, the driving signal according to the first signal, wherein the first transformer operates according to the first voltage or the second voltage.

16. The power amplifying method of claim 15, further comprising:
receiving, by a first switch circuit of the power switching circuit, the first voltage, wherein the first switch circuit is turned on under a condition that the operation mode of the power amplifier is the Wi-Fi mode to output the first voltage to the first transformer; and receiving, by a second switch circuit of the power switching circuit, the second voltage, wherein the second switch circuit is turned on under a condition that the operation mode of the power amplifier is the Blue-tooth mode to output the second voltage to the first transformer.

17. The power amplifying method of claim 15, further comprising:

generating, by an amplifier of the amplifier circuit, an amplified signal according to the driving signal; and generating, by a second transformer of the amplifier circuit, the output signal according to the amplified signal, wherein the second transformer operates according to the first voltage or the second voltage.

18. The power amplifying method of claim 17, further comprising:

receiving, by a first switch circuit of the power switching circuit, the first voltage, wherein the first switch circuit is turned on under a condition that the operation mode of the power amplifier is the Wi-Fi mode to output the first voltage to the second transformer; and receiving, by a second switch circuit of the power switching circuit, the second voltage, wherein the second switch circuit is turned on under a condition that the operation mode of the power amplifier is the Blue-tooth mode to output the second voltage to the second transformer.

* * * * *